United States Patent
Seki

(10) Patent No.: US 12,347,697 B2
(45) Date of Patent: Jul. 1, 2025

(54) PREWET MODULE AND PREWET METHOD

(71) Applicant: EBARA CORPORATION, Tokyo (JP)

(72) Inventor: Masaya Seki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/761,841

(22) PCT Filed: May 31, 2021

(86) PCT No.: PCT/JP2021/020614
§ 371 (c)(1),
(2) Date: Dec. 8, 2022

(87) PCT Pub. No.: WO2022/254486
PCT Pub. Date: Dec. 8, 2022

(65) Prior Publication Data
US 2024/0047235 A1  Feb. 8, 2024

(51) Int. Cl.
*H01L 21/67* (2006.01)
*C25D 7/12* (2006.01)

(52) U.S. Cl.
CPC .......... *H01L 21/67051* (2013.01); *C25D 7/12* (2013.01)

(58) Field of Classification Search
CPC ................................................ H01L 21/67051
See application file for complete search history.

(56) References Cited

U.S. PATENT DOCUMENTS

| | | | |
|---|---|---|---|
| 2013/0171833 A1* | 7/2013 | Buckalew | H01L 21/67138 438/758 |
| 2016/0042980 A1 | 2/2016 | Ohashi | |
| 2018/0179656 A1 | 6/2018 | Okuzono et al. | |

FOREIGN PATENT DOCUMENTS

| | | |
|---|---|---|
| JP | 2000-256897 A | 9/2000 |
| JP | 2004-269923 A | 9/2004 |

(Continued)

OTHER PUBLICATIONS

Machine translation: JP2000256987; Hirae et al. (Year: 2000).*

*Primary Examiner* — Natasha N Campbell
(74) *Attorney, Agent, or Firm* — BakerHostetler

(57) ABSTRACT

Efficiency of a cleaning process and a degassing process for a surface to be processed of a substrate is improved.

A pre-wet module 200 includes a stage 220, a rotation mechanism 224, a pre-wet chamber 260, an elevating mechanism 230, a degassing liquid supply member 204, a nozzle 268, and a cleaning liquid supply member 202. The stage 220 is configured to hold a back surface of a substrate WF with a surface to be processed WF-a facing upward. The rotation mechanism 224 is configured to rotate the stage 220. The pre-wet chamber 260 includes a lid member 262 and a tubular member 264. The lid member 262 has an opposed surface 262a opposed to the surface to be processed WF-a of the substrate WF. The tubular member 264 is installed on an outer edge portion of the opposed surface 262a of the lid member 262. The elevating mechanism 230 is configured to move up and down the pre-wet chamber 260. The degassing liquid supply member 204 is configured to supply a degassing liquid to a pre-wet space 269 formed between the pre-wet chamber 260 and the surface to be processed WF-a of the substrate WF. The nozzle 268 is installed on the opposed surface 262a of the lid member 262. The cleaning liquid supply member 202 is configured to supply a cleaning liquid to the surface to be processed WF-a of the substrate WF via the nozzle 268.

4 Claims, 6 Drawing Sheets

(56) References Cited

FOREIGN PATENT DOCUMENTS

| | | |
|---|---|---|
| JP | 2005-150512 A | 6/2005 |
| JP | 2018-104799 A | 7/2018 |
| JP | 2019-112685 A | 7/2019 |
| KR | 2015-0119307 A | 10/2015 |

* cited by examiner

PREWET MODULE AND PREWET METHOD

TECHNICAL FIELD

This application relates to a pre-wet module and a pre-wet method.

BACKGROUND ART

A plating apparatus for performing a plating process on a substrate (for example, a semiconductor wafer) includes a pre-wet module that performs various kinds of pretreatments, such as a degassing process, on the substrate, and a plating module that performs the plating process on the substrate on which the pretreatment has been performed.

For example, PTL 1 discloses a pre-wet module that performs a pretreatment by arranging a holder holding a substrate in a pre-wet tank, and, while vacuum-drawing a space to which a surface to be processed of the substrate is exposed, supplying a pre-wet liquid to the space.

CITATION LIST

Patent Literature

PTL 1: Japanese Unexamined Patent Application Publication No. 2018-104799

SUMMARY OF INVENTION

Technical Problem

However, the prior art has a room for improvement in improving efficiency of a cleaning process and a degassing process for a surface to be processed of a substrate.

That is, since the prior art is to perform the degassing process by filling a space to which the surface to be processed of the substrate is exposed with a pre-wet liquid, a removal of dust and the like inside a pattern formed on the surface to be processed possibly fails. Even when the dust and the like are removed to an outside of the pattern, the space to which the surface to be processed of the substrate is exposed is a closed space, and therefore, in some cases, the dust and the like accumulate on the surface to be processed of the substrate again. As a result, it is possible that the cleaning fails to be performed sufficiently. The prior art performs the degassing process with the substrate perpendicularly suspended. Accordingly, the surface to be processed of the substrate faces a lateral direction, and thus, an efficient performance of a process to replace the air inside the pattern formed on the surface to be processed with a degassing liquid possibly fails.

Therefore, one of the purposes of this application is to improve efficiency of a cleaning process and a degassing process for a surface to be processed of a substrate.

Solution to Problem

According to one embodiment, there is disclosed a pre-wet module that includes a stage, a rotation mechanism, a pre-wet chamber, an elevating mechanism, a degassing liquid supply member, a nozzle, and a cleaning liquid supply member. The stage is configured to hold a back surface of a substrate with a surface to be processed facing upward. The rotation mechanism is configured to rotate the stage. The pre-wet chamber includes a lid member and a tubular member. The lid member has an opposed surface opposed to the surface to be processed of the substrate. The tubular member is installed on an outer edge portion of the opposed surface of the lid member. The elevating mechanism is configured to move up and down the pre-wet chamber. The degassing liquid supply member is configured to supply a degassing liquid to a pre-wet space formed between the pre-wet chamber and the surface to be processed of the substrate. The nozzle is installed on the opposed surface of the lid member. The cleaning liquid supply member is configured to supply a cleaning liquid to the surface to be processed of the substrate via the nozzle.

DESCRIPTION OF EMBODIMENTS

Figure 1:
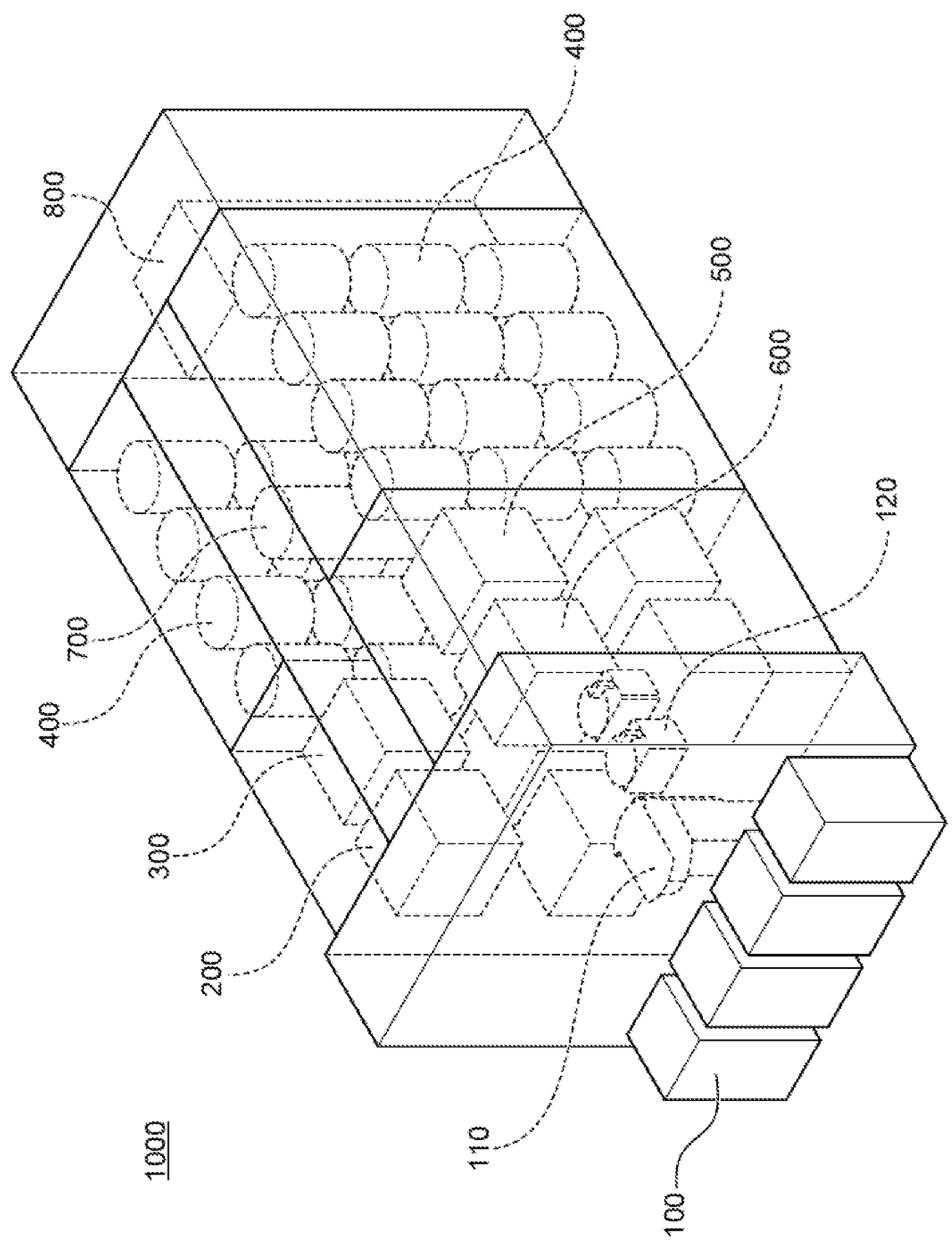
FIG. 1 is a perspective view illustrating an overall configuration of a plating apparatus according to an embodiment.

The following describes embodiments of the present invention with reference to the drawings. In the drawings described below, the same or equivalent components are attached with the same reference numerals to omit the overlapping descriptions.

<Overall Configuration of Plating Apparatus>

Figure 2:
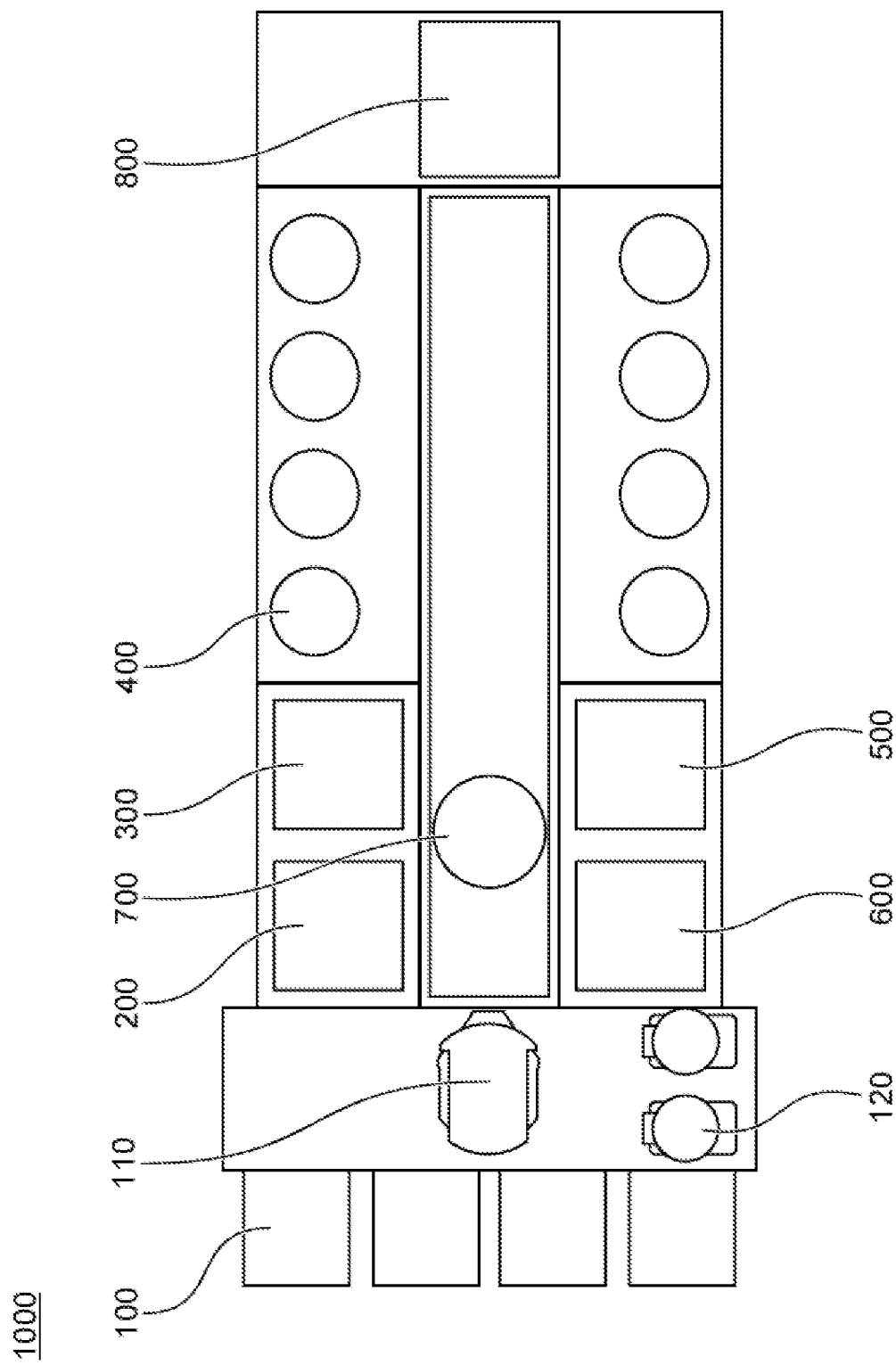
FIG. 2 is a plan view illustrating an overall configuration of the plating apparatus according to the embodiment.

FIG. 1 is a perspective view illustrating the overall configuration of the plating apparatus of this embodiment. FIG. 2 is a plan view illustrating the overall configuration of the plating apparatus of this embodiment. As illustrated in FIGS. 1 and 2, a plating apparatus 1000 includes load ports 100, a transfer robot 110, aligners 120, pre-wet modules 200, pre-soak modules 300, plating modules 400, cleaning modules 500, spin rinse dryers 600, a transfer device 700, and a control module 800.

The load port 100 is a module for loading a substrate housed in a cassette, such as a FOUP, (not illustrated) to the plating apparatus 1000 and unloading the substrate from the plating apparatus 1000 to the cassette. While the four load ports 100 are arranged in the horizontal direction in this embodiment, the number of load ports 100 and arrangement of the load ports 100 are arbitrary. The transfer robot 110 is a robot for transferring the substrate that is configured to grip or release the substrate between the load port 100, the aligner 120, and the transfer device 700. The transfer robot 110 and the transfer device 700 can perform delivery and receipt of the substrate via a temporary placement table (not illustrated) to grip or release the substrate between the transfer robot 110 and the transfer device 700.

The aligner 120 is a module for adjusting a position of an orientation flat, a notch, and the like of the substrate in a predetermined direction. While the two aligners 120 are disposed to be arranged in the horizontal direction in this embodiment, the number of aligners 120 and arrangement of the aligners 120 are arbitrary. The pre-wet module 200 wets a surface to be plated of the substrate before a plating process with a process liquid, such as pure water or deaerated water, to replace air inside a pattern formed on the surface of the substrate with the process liquid. The pre-wet module 200 is configured to perform a pre-wet process to facilitate supplying the plating solution to the inside of the pattern by replacing the process liquid inside the pattern with a plating solution during plating. While the two pre-wet modules 200 are disposed to be arranged in the vertical direction in this embodiment, the number of pre-wet modules 200 and arrangement of the pre-wet modules 200 are arbitrary.

For example, the pre-soak module 300 is configured to remove an oxidized film having a large electrical resistance present on a surface of a seed layer formed on the surface to be plated of the substrate before the plating process by etching with a process liquid, such as sulfuric acid and hydrochloric acid, and perform a pre-soak process that cleans or activates a surface of a plating base layer. While the two pre-soak modules 300 are disposed to be arranged in the vertical direction in this embodiment, the number of pre-soak modules 300 and arrangement of the pre-soak modules 300 are arbitrary. The plating module 400 performs the plating process on the substrate. There are two sets of the 12 plating modules 400 arranged by three in the vertical direction and by four in the horizontal direction, and the total 24 plating modules 400 are disposed in this embodiment, but the number of plating modules 400 and arrangement of the plating modules 400 are arbitrary.

The cleaning module 500 is configured to perform a cleaning process on the substrate to remove the plating solution or the like left on the substrate after the plating process. While the two cleaning modules 500 are disposed to be arranged in the vertical direction in this embodiment, the number of cleaning modules 500 and arrangement of the cleaning modules 500 are arbitrary. The spin rinse dryer 600 is a module for rotating the substrate after the cleaning process at high speed and drying the substrate. While the two spin rinse dryers are disposed to be arranged in the vertical direction in this embodiment, the number of spin rinse dryers and arrangement of the spin rinse dryers are arbitrary. The transfer device 700 is a device for transferring the substrate between the plurality of modules inside the plating apparatus 1000. The control module 800 is configured to control the plurality of modules in the plating apparatus 1000 and can be configured of, for example, a general computer including input/output interfaces with an operator or a dedicated computer.

An example of a sequence of the plating processes by the plating apparatus 1000 will be described. First, the substrate housed in the cassette is loaded on the load port 100. Subsequently, the transfer robot 110 grips the substrate from the cassette at the load port 100 and transfers the substrate to the aligners 120. The aligner 120 adjusts the position of the orientation flat, the notch, or the like of the substrate in the predetermined direction. The transfer robot 110 grips or releases the substrate whose direction is adjusted with the aligners 120 to the transfer device 700.

The transfer device 700 transfers the substrate received from the transfer robot 110 to the pre-wet module 200. The pre-wet module 200 performs the pre-wet process on the substrate. The transfer device 700 transfers the substrate on which the pre-wet process has been performed to the pre-soak module 300. The pre-soak module 300 performs the pre-soak process on the substrate. The transfer device 700 transfers the substrate on which the pre-soak process has been performed to the plating module 400. The plating module 400 performs the plating process on the substrate.

The transfer device 700 transfers the substrate on which the plating process has been performed to the cleaning module 500. The cleaning module 500 performs the cleaning process on the substrate. The transfer device 700 transfers the substrate on which the cleaning process has been performed to the spin rinse dryer 600. The spin rinse dryer 600 performs the drying process on the substrate. The transfer device 700 grips or releases the substrate on which the drying process has been performed to the transfer robot 110. The transfer robot 110 transfers the substrate received from the transfer device 700 to the cassette at the load port 100. Finally, the cassette housing the substrate is unloaded from the load port 100.

<Configuration of Pre-Wet Module>

Next, the configuration of the pre-wet module 200 will be described. Since the two pre-wet modules 200 according to this embodiment have the same configurations, only one pre-wet module 200 will be described.

Figure 3:
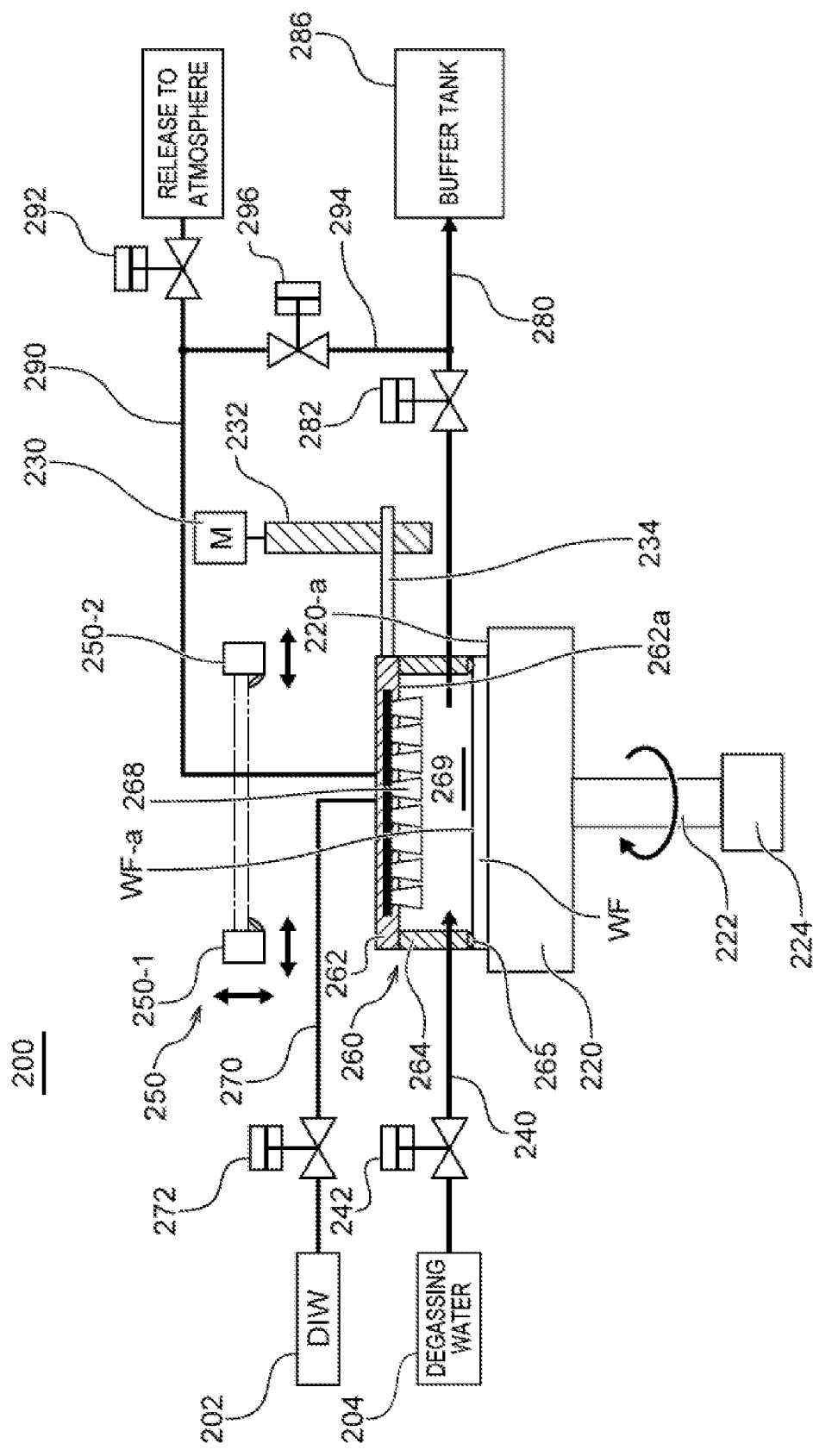
FIG. 3 is a vertical cross-sectional view schematically illustrating a configuration of a pre-wet module according to one embodiment.
Figure 4:
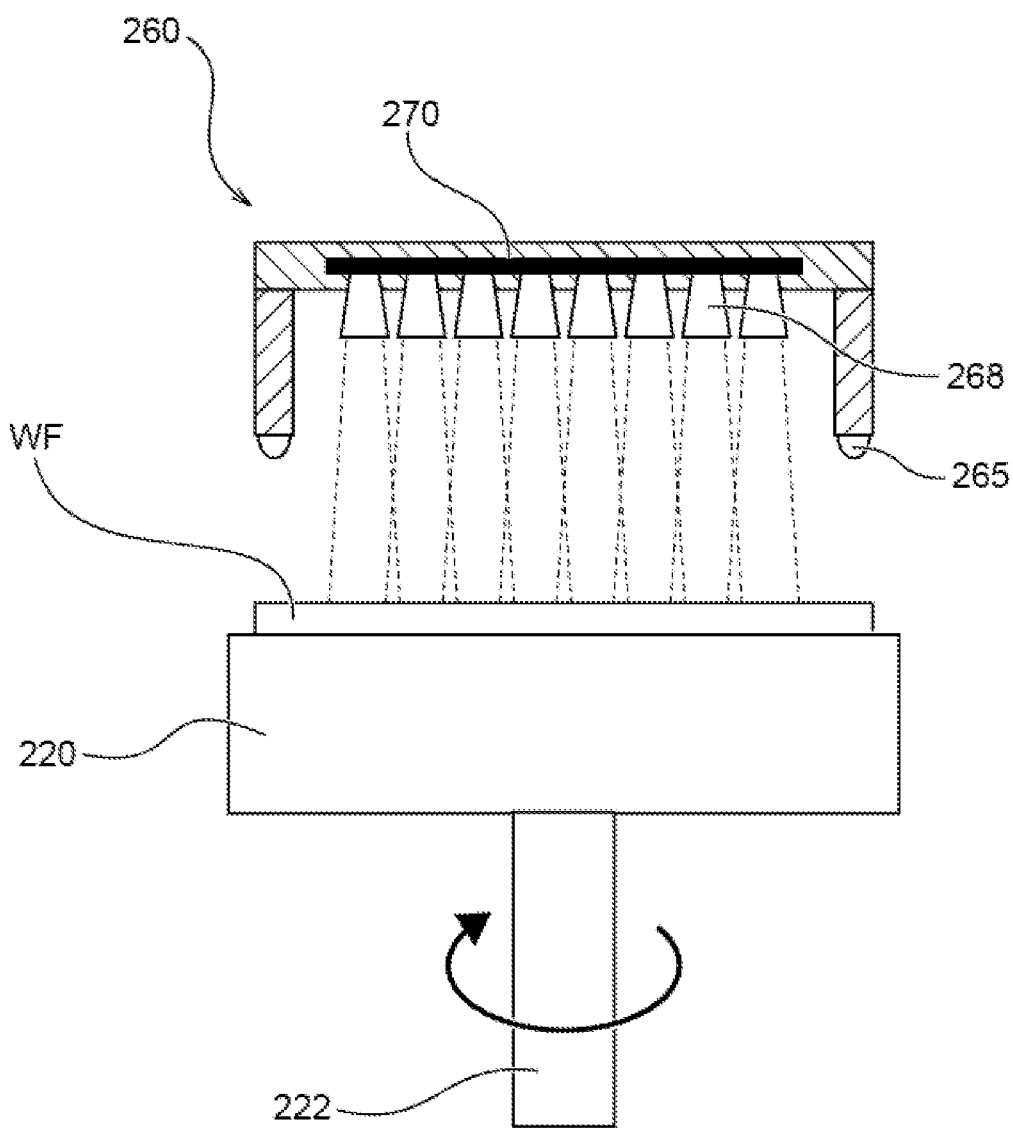
FIG. 4 is a vertical cross-sectional view schematically illustrating a state of performing a cleaning process using the pre-wet module according to the one embodiment.

FIG. 3 is a vertical cross-sectional view schematically illustrating a configuration of a pre-wet module according to one embodiment. FIG. 4 is a vertical cross-sectional view schematically illustrating a state of performing the cleaning process using the pre-wet module according to the one embodiment. As illustrated in FIG. 3, the pre-wet module 200 includes a stage 220 in a circular-plate shape configured to hold a substrate WF. The stage 220 has a substrate holding surface 220a for holding a back surface of a surface to be processed WF-a of the substrate WF, and is configured to hold the substrate WF with the surface to be processed WF-a facing upward. The stage 220 is connected to a vacuum source (not illustrated), and is configured to hold the substrate WF by vacuum-suctioning the back surface of the substrate WF. The stage 220 has a lower surface on which a shaft 222 extending in the vertical direction is installed at the center. The pre-wet module 200 includes a rotation mechanism 224 configured to rotate the stage 220 about an axis of the shaft 222. The rotation mechanism 224 is configured to rotate the stage 220 while the cleaning process and the degassing process are being performed.

The pre-wet module 200 includes a pre-wet chamber 260 disposed on an upper portion of the stage 220. The pre-wet chamber 260 has a lid member 262 in a circular-plate shape having an opposed surface 262a opposed to the surface to be processed WF-a of the substrate WF and a tubular member 264 installed on an outer edge portion of the opposed surface 262a of the lid member 262. The pre-wet module 200 includes an elastic member 265 installed at a lower end of the tubular member 264. The elastic member 265 is, for example, an O-ring.

The pre-wet module 200 includes an elevating mechanism 230 configured to move up and down the pre-wet chamber 260. The elevating mechanism 230 moves up and down a bracket 234 installed on the pre-wet chamber 260 along a shaft 232 extending in the vertical direction, and thus, is configured to move up and down the pre-wet chamber 260. The elevating mechanism 230 can be achieved, for example, by a known mechanism, such as a motor. The elevating mechanism 230 is configured to move up and down the pre-wet chamber 260 between a degassing position illustrated in FIG. 3 and a cleaning position illustrated in FIG. 4. As illustrated in FIG. 4, the cleaning position is a position where the pre-wet chamber 260 (the elastic member 265) is not in contact with the surface to be processed WF-a of the substrate WF. Meanwhile, as illustrated in FIG. 3, the degassing position is a position lower than the cleaning position, and is a position where the pre-wet chamber 260 (the elastic member 265) is in contact with the surface to be processed WF-a of the substrate WF in this embodiment.

Note that while this embodiment has described the example in which the tubular member 264 has a diameter approximately the same as a diameter of the substrate WF, and the elastic member 265 is in contact with the outer edge portion of the surface to be processed WF-a of the substrate WF, the example is not limited to this. For example, the diameter of the tubular member 264 may be formed larger than the diameter of the substrate WF such that the elastic member 265 comes into contact with the substrate holding surface 220a. When the pre-wet chamber 260 is in the degassing position, a pre-wet space 269 is formed between the pre-wet chamber 260 and the surface to be processed WF-a of the substrate WF.

The pre-wet module 200 includes a degassing liquid supply member 204 for supplying the degassing liquid (for example, deaerated water) to the pre-wet space 269. The pre-wet module 200 includes a degassing liquid pipe 240 connecting the degassing liquid supply member 204 to the pre-wet space 269 via the tubular member 264, and a degassing liquid valve 242 configured to open and close the degassing liquid pipe 240. The degassing liquid valve 242 is configured to be closed when the degassing process is not performed and to be opened when the degassing process is performed. The degassing liquid supply member 204 is configured to supply the degassing liquid to the pre-wet space 269 via the degassing liquid pipe 240 in a state where the pre-wet chamber 260 is arranged in the degassing position by the elevating mechanism 230 as illustrated in FIG. 3.

The pre-wet module 200 includes a plurality of nozzles 268 installed on the opposed surface 262a of the lid member 262. The pre-wet module 200 includes a cleaning liquid supply member 202 configured to supply a cleaning liquid (for example, pure water) to the surface to be processed WF-a of the substrate WF via the nozzles 268. The pre-wet module 200 includes a cleaning liquid pipe 270 connecting the cleaning liquid supply member 202 to the nozzles 268 and a cleaning liquid valve 272 configured to open and close the cleaning liquid pipe 270. The cleaning liquid valve 272 is configured to be closed when the cleaning process is not performed and to be opened when the cleaning process is performed. The cleaning liquid supply member 202 is configured to supply the cleaning liquid to the surface to be processed WF-a of the substrate WF via the nozzles 268 in a state where the pre-wet chamber 260 is disposed in the cleaning position by the elevating mechanism 230 as illustrated in FIG. 4.

The pre-wet module 200 includes a substrate station 250 for gripping or releasing the substrate WF with the stage 220. The substrate station 250 includes a first arm member 250-1 and a second arm member 250-2 for holding the back surface of the surface to be processed WF-a of the substrate WF. The first arm member 250-1 and the second arm member 250-2 are disposed to be arranged and separated in a horizontal direction. The first arm member 250-1 and the second arm member 250-2 are movable in the horizontal direction and the vertical direction by a driving device (not illustrated). The substrate station 250 is configured to install the substrate WF received from the transfer device 700 onto the stage 220, and to receive the substrate WF on which the cleaning process and the degassing process have been terminated from the stage 220 and pass it to the transfer device 700.

The pre-wet module 200 includes a vent pipe 290 that communicates the pre-wet space 269 with an outside (atmosphere) of the pre-wet chamber 260 via the lid member 262, and a vent valve 292 configured to open and close the vent pipe 290. The vent valve 292 is configured to be opened until the pre-wet space 269 is fulfilled with the degassing liquid in the degassing process. That is, when air is present in the pre-wet space 269 during the degassing process, the air possibly dissolves in the degassing liquid to reduce the efficiency of the degassing process. Therefore, when the degassing process is performed, the vent valve 292 is opened so as to remove the air from the pre-wet space 269 as a closed space, in order to fulfill the pre-wet space 269 with the degassing liquid. Meanwhile, the vent valve 292 is configured to be closed when the pre-wet space 269 is fulfilled with the degassing liquid. This is because the degassing liquid flows out via the vent pipe 290 if the vent valve 292 is kept open when the degassing liquid is continued to be supplied from the degassing liquid supply member 204 in order to accelerate the degassing process even after the pre-wet space 269 is fulfilled with the degassing liquid.

The pre-wet module 200 includes a discharge pipe 280 for discharging the degassing liquid stored in the pre-wet space 269 via the tubular member 264 and a discharge valve 282 configured to open and close the discharge pipe 280. The discharge pipe 280 is connected to a buffer tank 286. The discharge valve 282 is configured to be closed while the degassing process is being performed and be opened when the degassing process is terminated. After the degassing process is terminated, the degassing liquid is accumulated in the buffer tank 286 via the discharge pipe 280.

The pre-wet module 200 includes a bypass pipe 294 connecting the vent pipe 290 to the discharge pipe 280 and a bypass valve 296 configured to open and close the bypass pipe 294. The bypass pipe 294 is configured to connect a side of the pre-wet space 269 in the vent pipe 290 with respect to the vent valve 292 to a side of the buffer tank 286 in the discharge pipe 280 with respect to the discharge valve 282. The bypass valve 296 is configured to be closed until the pre-wet space 269 is fulfilled with the degassing liquid in the degassing process. This is because if the bypass valve 296 is open, until the pre-wet space 269 is fulfilled with the degassing liquid, the air is sent to the buffer tank 286 via the vent pipe 290, the bypass pipe 294, and the discharge pipe 280 and the air dissolves into the degassing liquid in the buffer tank 286. Meanwhile, the bypass valve 296 is configured to be opened when the pre-wet space 269 is fulfilled with the degassing liquid. This is to send the degassing liquid flowing in the vent pipe 290 to the buffer tank 286 via the bypass pipe 294 and the discharge pipe 280 when the degassing liquid is continued to be supplied from the degassing liquid supply member 204 in order to accelerate the degassing process even after the pre-wet space 269 is fulfilled with the degassing liquid.

The pre-wet module 200 according to the embodiment ensures performing the degassing process with the surface to be processed WF-a of the substrate WF facing upward. Accordingly, the air inside the pattern, such as a resist of the surface to be processed WF-a, raises with respect to the degassing liquid to be easily dissolved, and as the result, the air inside the pattern can be efficiently replaced with the degassing liquid. The pre-wet module 200 according to this embodiment cleans the surface to be processed WF-a by injecting the cleaning liquid from the nozzles 268 disposed to be opposed to the surface to be processed WF-a, thereby ensuring efficiently washing the dust and the like inside the pattern of the surface to be processed WF-a out of the inside of the pattern. In addition to this, the pre-wet module 200 according to this embodiment performs the cleaning process while rotating the stage 220 with the pre-wet chamber 260 in the cleaning position where the pre-wet chamber 260 does not come into contact with the surface to be processed WF-a of the substrate WF, thereby ensuring flowing out the dust and the like washed out of the inside of the pattern to the outside in the radial direction of the substrate WF without causing them to accumulate on the surface to be processed WF-a again. Thus, the pre-wet module 200 according to this embodiment ensures improving the efficiency of the cleaning process and the degassing process as described above.

Figure 5:
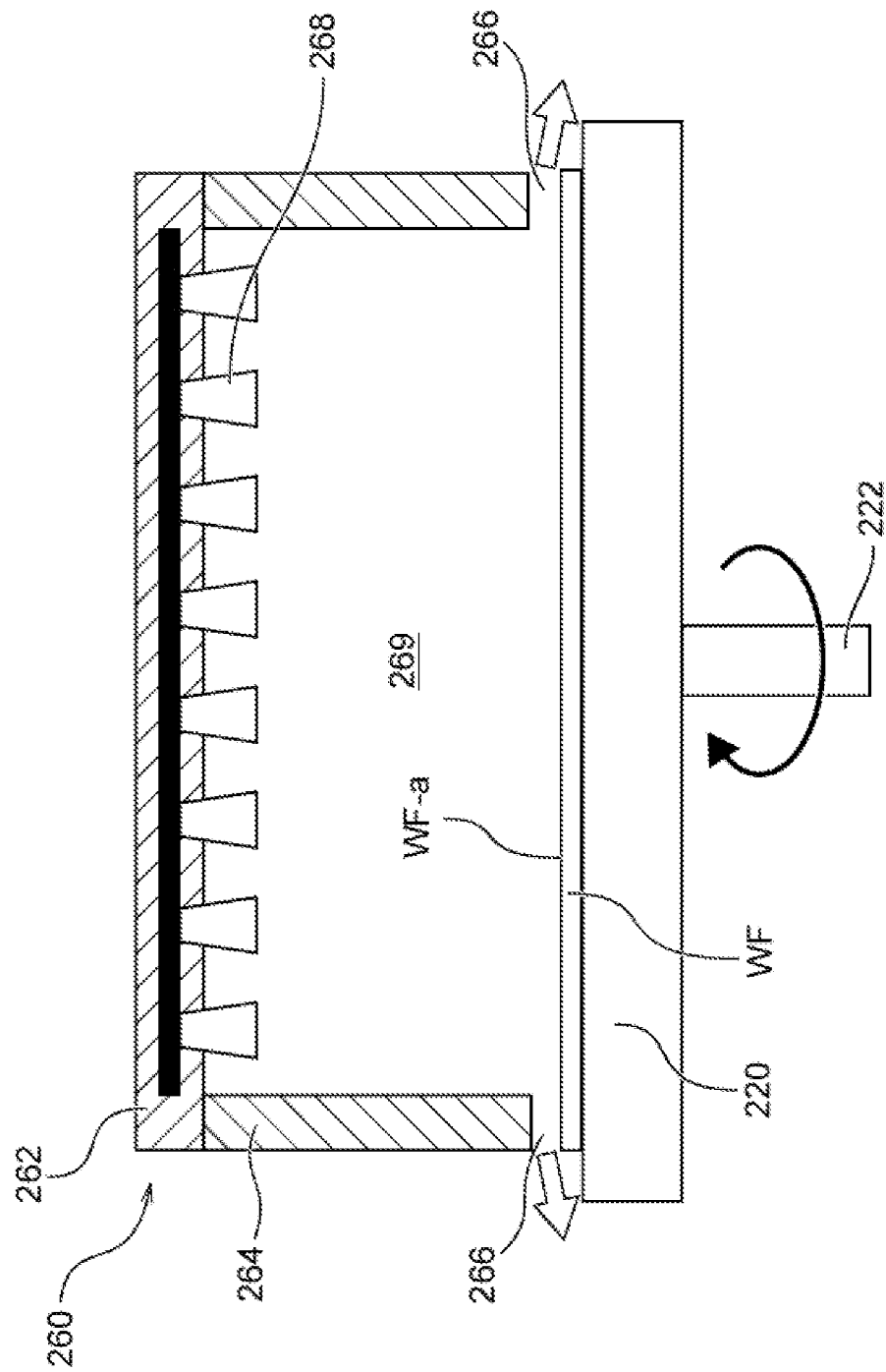
FIG. 5 is a vertical cross-sectional view schematically illustrating a configuration of a pre-wet module according to another embodiment.

While the above-described embodiment has described the example where the degassing process is performed with the pre-wet chamber 260 disposed in the degassing position where the elastic member 265 comes into contact with the surface to be processed WF-a of the substrate WF, the example is not limited to this. FIG. 5 is a vertical cross-sectional view schematically illustrating a configuration of a pre-wet module according to another embodiment. The embodiment illustrated in FIG. 5 is similar to the embodiment illustrated in FIG. 4 except that the elastic member 265 is not installed at the lower end of the tubular member 264 and that the degassing position of the pre-wet chamber 260 is different, and therefore, the description of the overlapping configuration is omitted.

The degassing position in this embodiment is a position where a clearance 266 is formed between the lower end of the tubular member 264 and the surface to be processed WF-a of the substrate WF as illustrated in FIG. 5. The elevating mechanism 230 is configured to dispose the pre-wet chamber 260 in the degassing position where the clearance 266 is formed between the lower end of the tubular member 264 and the surface to be processed WF-a of the substrate WF when the degassing process is performed. The formation of the clearance 266 causes the degassing liquid supplied to the pre-wet space 269 when the degassing process is performed to be leaked out of the pre-wet space 269 via the clearance 266. Here, when the interval between the lower end of the tubular member 264 and the surface to be processed WF-a of the substrate WF is too large, an amount of the degassing liquid flowing out from the interval increases during the degassing process, and therefore, it is difficult to fulfill the pre-wet space 269 with the degassing liquid even though the degassing liquid is continued to be supplied from the degassing liquid supply member 204. Accordingly, the clearance 266 has an interval such that the amount of the degassing liquid leaking out of the clearance 266 is less than the amount of the degassing liquid supplied to the pre-wet space 269 from the degassing liquid supply member 204 when the degassing process is performed, for example, an interval of a few cm or less, preferably a few mm or less.

According to this embodiment, in addition to ensure improving the efficiency of the cleaning process and the degassing process similarly to the embodiment illustrated in FIG. 3, the efficiency of the degassing process can be even more improved. That is, according to this embodiment, since the degassing liquid leaks out of the clearance 266 while the degassing process is being performed, a flow of the degassing liquid heading for the outer edge portion is formed from the center in the surface to be processed WF-a of the substrate WF. Accordingly, the degassing liquid in which the air inside the pattern, such as a resist of the surface to be processed WF-a is dissolved is leaked out of the clearance 266, thus ensuring sequentially sending the degassing liquid in which the air supplied from the degassing liquid supply member 204 is not contained to the surface to be processed WF-a. As the result, the air inside the pattern can be efficiently replaced with the degassing liquid, thereby ensuring efficiently performing the degassing process.

Figure 6:
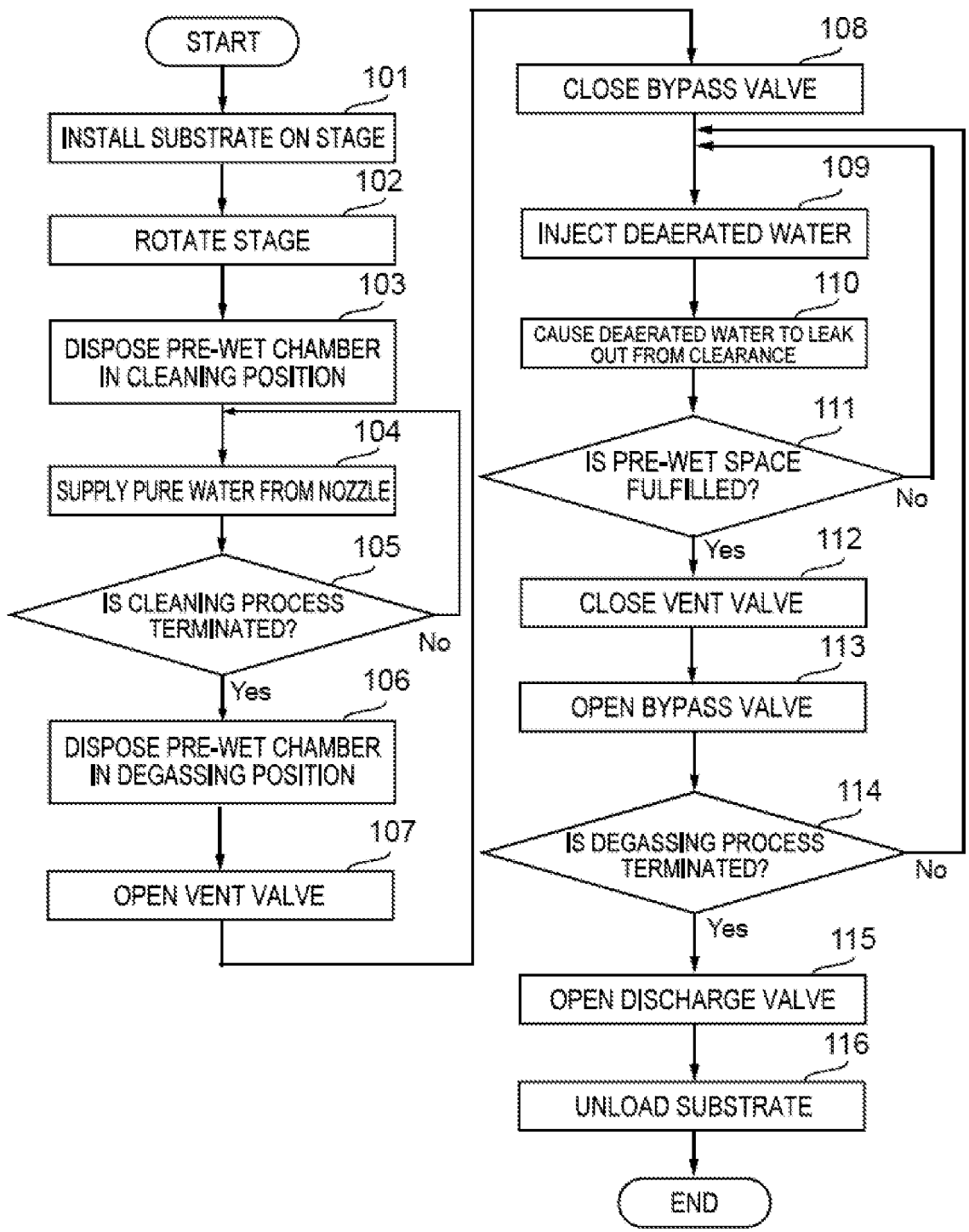
FIG. 6 is a flowchart illustrating a pre-wet method using a pre-wet module according to the one embodiment.

Next, a pre-wet method according to this embodiment will be described. FIG. 6 is a flowchart illustrating the pre-wet method using the pre-wet module according to one embodiment. As illustrated in FIG. 6, the pre-wet method installs the substrate WF with the surface to be processed WF-a facing upward onto the stage 220 by the substrate station 250 (an installation step 101). Subsequently, the pre-wet method rotates the stage 220 by the rotation mechanism 224 (a rotation step 102). The rotation step 102 is continued until the subsequent cleaning process and degassing process are terminated.

Subsequently, the pre-wet method disposes the pre-wet chamber 260 in the cleaning position (a first disposing step 103). Subsequently, the pre-wet method opens the cleaning liquid valve 272 and supplies the cleaning liquid to the surface to be processed WF-a of the substrate WF via the nozzles 268 in the state where the pre-wet chamber 260 is arranged in the cleaning position by the first disposing step 103 (a cleaning step 104). Subsequently, the pre-wet method determines whether the cleaning process of the substrate WF is terminated or not (a step 105). The pre-wet method repeats the cleaning step 104 until the cleaning process of the substrate WF is terminated.

Meanwhile, when the cleaning process of the substrate WF is determined to be terminated (Yes at the step 105), the pre-wet method disposes the pre-wet chamber 260 in the degassing position lower than the cleaning position (a second disposing step 106). In the case of the pre-wet module 200 according to the embodiment illustrated in FIG. 3, the second disposing step 106 disposes the pre-wet chamber 260 in the degassing position where the elastic member 265 installed at the lower end of the tubular member 264 comes into contact with the surface to be processed WF-a of the substrate WF. Meanwhile, in the case of the pre-wet module 200 according to the embodiment illustrated in FIG. 5, the second disposing step 106 disposes the pre-wet chamber 260 in the degassing position where the clearance 266 is formed between the lower end of the tubular member 264 and the surface to be processed WF-a of the substrate WF.

Subsequently, the pre-wet method opens the vent valve 292 when the vent valve 292 disposed in the vent pipe 290 is closed (an opening step 107). Subsequently, the pre-wet method closes the bypass valve 296 when the bypass valve 296 disposed in the bypass pipe 294 is opened (a bypass closing step 108). This allows releasing the air to the atmosphere from the inside of the pre-wet space 269 and allows the reduced air inside the pre-wet space 269 flowing into the buffer tank 286. Note that from the second disposing step 106 to the bypass closing step 108, the order may be switched or they may be simultaneously performed.

Subsequently, while the pre-wet chamber 260 is disposed in the degassing position by the second disposing step 106, the pre-wet method opens the degassing liquid valve 242, and supplies the degassing liquid to the pre-wet space 269 (a degassing step 109). When the degassing step 109 is performed and the degassing liquid is supplied to the pre-wet space 269, the pre-wet method causes the degassing liquid supplied to the pre-wet space 269 to be leaked out to the outside of the pre-wet space 269 via the clearance 266 (a leak out step 110). The leak out step 110 is not performed in the case of the pre-wet method using the pre-wet module 200 according to the embodiment illustrated in FIG. 3.

The vent valve 292 opened by the opening step 107 is kept open until the pre-wet space 269 is fulfilled with the degassing liquid at the degassing step 109. The bypass valve 296 closed by the bypass closing step 108 is kept closed until the pre-wet space 269 is fulfilled with the degassing liquid at the degassing step 109. That is, the pre-wet method determines whether the pre-wet space 269 is fulfilled with the degassing liquid or not (a step 111). The step 111 is, for example, performed using a liquid surface level sensor disposed in the pre-wet chamber 260. The pre-wet method repeats the degassing step 109 and the leak out step 110 until the pre-wet space 269 is fulfilled with the degassing liquid.

Meanwhile, when it is determined that the pre-wet space 269 is fulfilled with the degassing liquid (Yes at the step 111), the pre-wet method closes the vent valve 292 when the vent valve 292 is open (a closing step 112), and opens the bypass valve 296 when the bypass valve 296 is closed (a bypass step 113). This ensures reusing the degassing liquid supplied to the pre-wet space 269 by flowing it to the buffer tank 286 via the bypass pipe 294.

Subsequently, the pre-wet method determines whether the degassing process of the substrate WF is terminated or not (a step 114). The pre-wet method repeats the process by returning to the degassing step 109 until the degassing process of the substrate WF is terminated. Meanwhile, the pre-wet method opens the discharge valve 282 (a step 115) when the degassing process of the substrate WF is determined to be terminated (Yes at the step 114). This ensures removing the degassing liquid from the pre-wet space 269. Subsequently, the pre-wet method unloads the substrate WF from the pre-wet module 200 by the substrate station 250 and the transfer device 700 (a step 116), and terminates the pretreatment.

While some embodiments of the present invention have been described above, the above-described embodiments of the invention are for ease of understanding the present invention, and are not for limiting the present invention. It is obvious that the present invention can be changed or improved without departing from its gist, and that the present invention encompasses its equivalents. Within a range that can solve at least a part of the above-described problems or a range that provides at least a part of the effects, any combination or omission of each component described in the claim and the description is allowed.

This application discloses a pre-wet module that includes a stage, a rotation mechanism, a pre-wet chamber, an elevating mechanism, a degassing liquid supply member, a nozzle, and a cleaning liquid supply member. The stage is configured to hold a back surface of a substrate with a surface to be processed facing upward. The rotation mechanism is configured to rotate the stage. The pre-wet chamber includes a lid member and a tubular member. The lid member has an opposed surface opposed to the surface to be processed of the substrate. The tubular member is installed on an outer edge portion of the opposed surface of the lid member. The elevating mechanism is configured to move up and down the pre-wet chamber. The degassing liquid supply member is configured to supply a degassing liquid to a pre-wet space formed between the pre-wet chamber and the surface to be processed of the substrate. The nozzle is installed on the opposed surface of the lid member. The cleaning liquid supply member is configured to supply a cleaning liquid to the surface to be processed of the substrate via the nozzle, as one embodiment.

Furthermore, this application discloses the pre-wet module in which the cleaning liquid supply member is configured to supply the cleaning liquid to the surface to be processed of the substrate via the nozzle in a state where the pre-wet chamber is disposed in a cleaning position where the pre-wet chamber is not in contact with the surface to be processed of the substrate or the substrate holding surface of the stage by the elevating mechanism, and the degassing liquid supply member is configured to supply the degassing liquid to the pre-wet space in a state where the pre-wet chamber is disposed in a degassing position lower than the cleaning position by the elevating mechanism, as one embodiment.

Furthermore, this application discloses the pre-wet module in which the elevating mechanism is configured to dispose the pre-wet chamber in the degassing position where a clearance is formed between a lower end of the tubular member and the surface to be processed of the substrate or the substrate holding surface of the stage when the degassing process is performed, as one embodiment.

Furthermore, this application discloses the pre-wet module in which the pre-wet chamber includes an elastic member installed at a lower end of the tubular member, and the elevating mechanism is configured to dispose the pre-wet chamber in the degassing position where the elastic member comes into contact with the surface to be processed of the substrate or the substrate holding surface of the stage when the degassing process is performed, as one embodiment.

Furthermore, this application discloses the pre-wet module further including a vent pipe configured to communicate the pre-wet space with an outside of the pre-wet chamber via the lid member, and a vent valve configured to open and close the vent pipe, as one embodiment.

Furthermore, this application discloses the pre-wet module further including a discharge pipe for discharging the degassing liquid stored in the pre-wet space, a discharge valve configured to open and close the discharge pipe, a bypass pipe configured to connect the vent pipe to the discharge pipe, and a bypass valve configured to open and close the bypass pipe, as one embodiment.

Furthermore, this application discloses a pre-wet method including an installation step of installing a substrate onto a stage with a surface to be processed facing upward, a rotation step of rotating the stage, a first disposing step of disposing a pre-wet chamber in a cleaning position, the pre-wet chamber including a lid member and a tubular member, the lid member having an opposed surface opposed to the surface to be processed of the substrate, the tubular member being installed on an outer edge portion of the opposed surface of the lid member, a cleaning step of supplying a cleaning liquid to the surface to be processed of the substrate via a nozzle installed on the opposed surface of the lid member in a state where the pre-wet chamber is disposed in the cleaning position by the first disposing step, a second disposing step of disposing the pre-wet chamber in a degassing position lower than the cleaning position, and a degassing step of supplying a degassing liquid to the pre-wet space in a state where the pre-wet chamber is disposed in the degassing position by the second disposing step, as one embodiment.

Furthermore, this application discloses the pre-wet method in which the second disposing step is configured to dispose the pre-wet chamber in the degassing position where a clearance is formed between a lower end of the tubular member and the surface to be processed of the substrate or the substrate holding surface of the stage, as one embodiment.

Furthermore, this application discloses the pre-wet method further including a leak out step of causing the degassing liquid supplied to the pre-wet space to be leaked out to an outside of the pre-wet space via the clearance, as one embodiment.

Furthermore, this application discloses the pre-wet method in which the second disposing step is configured to dispose the pre-wet chamber in the degassing position where an elastic member installed at a lower end of the tubular member comes into contact with the surface to be processed of the substrate or the substrate holding surface of the stage, as one embodiment.

Furthermore, this application discloses the pre-wet method further including an opening step of opening a vent valve disposed in a vent pipe configured to communicate the pre-wet space with an outside of the pre-wet chamber via the lid member until the pre-wet space is fulfilled with the degassing liquid at the degassing step, and a closing step of closing the vent valve when the pre-wet space is fulfilled with the degassing liquid at the degassing step, as one embodiment.

Furthermore, this application discloses the pre-wet method further including a bypass closing step of closing a bypass valve disposed in a bypass pipe that connects a discharge pipe to the vent pipe until the pre-wet space is fulfilled with the degassing liquid at the degassing step, the discharge pipe being for discharging the degassing liquid stored in the pre-wet space and a bypass step of opening the bypass valve when the pre-wet space is fulfilled with the degassing liquid at the degassing step, as one embodiment.

REFERENCE SIGNS LIST

200 . . . pre-wet module
202 . . . cleaning liquid supply member
204 . . . degassing liquid supply member
220 . . . stage
220a . . . substrate holding surface
224 . . . rotation mechanism
230 . . . elevating mechanism
240 . . . degassing liquid pipe
242 . . . degassing liquid valve
250 . . . substrate station
250-1 . . . first arm member
250-2 . . . second arm member
260 . . . pre-wet chamber
262 . . . lid member
262a . . . opposed surface
264 . . . tubular member
265 . . . elastic member
266 . . . clearance
268 . . . nozzle
269 . . . pre-wet space
270 . . . cleaning liquid pipe
272 . . . cleaning liquid valve
280 . . . discharge pipe
282 . . . discharge valve
286 . . . buffer tank
290 . . . vent pipe
292 . . . vent valve
294 . . . bypass pipe
296 . . . bypass valve
1000 . . . plating apparatus
WF . . . substrate
WF-a . . . surface to be processed

The invention claimed is:

1. A pre-wet module comprising:
a stage configured to hold a back surface of a substrate with a surface to be processed facing upward;
a rotation mechanism configured to rotate the stage;
a pre-wet chamber including a lid member and a tubular member, the lid member having an opposed surface opposed to the surface to be processed of the substrate, the tubular member being installed on an outer edge portion of the opposed surface of the lid member;
an elevating mechanism configured to move up and down the pre-wet chamber;
a degassing liquid supply member configured to supply a degassing liquid to a pre-wet space formed between the pre-wet chamber and the surface to be processed of the substrate;
a nozzle installed on the opposed surface of the lid member;
a cleaning liquid supply member configured to supply a cleaning liquid to the surface to be processed of the substrate via the nozzle,
a vent pipe configured to communicate the pre-wet space with an outside of the pre-wet chamber via the lid member,
a vent valve configured to open and close the vent pipe,
a discharge pipe for discharging the degassing liquid stored in the pre-wet space;
a discharge valve configured to open and close the discharge pipe;
a bypass pipe configured to connect the vent pipe to the discharge pipe; and
a bypass valve configured to open and close the bypass pipe.

2. The pre-wet module according to claim 1, wherein
the cleaning liquid supply member is configured to supply the cleaning liquid to the surface to be processed of the substrate via the nozzle in a state where the pre-wet chamber is disposed in a cleaning position where the pre-wet chamber is not in contact with the surface to be processed of the substrate or a substrate holding surface of the stage by the elevating mechanism, and
the degassing liquid supply member is configured to supply the degassing liquid to the pre-wet space in a state where the pre-wet chamber is disposed in a degassing position lower than the cleaning position by the elevating mechanism.

3. The pre-wet module according to claim 2, wherein
the elevating mechanism is configured to dispose the pre-wet chamber in the degassing position where a clearance is formed between a lower end of the tubular member and the surface to be processed of the substrate or the substrate holding surface of the stage when a degassing process is performed.

4. The pre-wet module according to claim 2, wherein
the pre-wet chamber includes an elastic member installed at a lower end of the tubular member, and
the elevating mechanism is configured to dispose the pre-wet chamber in the degassing position where the elastic member comes into contact with the surface to be processed of the substrate or the substrate holding surface of the stage when the degassing process is performed.

* * * * *

UNITED STATES PATENT AND TRADEMARK OFFICE
CERTIFICATE OF CORRECTION

| | |
|---|---|
| PATENT NO. | : 12,347,697 B2 |
| APPLICATION NO. | : 17/761841 |
| DATED | : July 1, 2025 |
| INVENTOR(S) | : Masaya Seki |

Page 1 of 1

It is certified that error appears in the above-identified patent and that said Letters Patent is hereby corrected as shown below:

On the Title Page

Please insert the following:
--(86) PCT NO.: PCT/JP2021/020614
371 (c)(1),
(2) Date: March 18, 2022--

Signed and Sealed this
Second Day of September, 2025

Coke Morgan Stewart
*Acting Director of the United States Patent and Trademark Office*